US008589833B2

(12) United States Patent
Motiani et al.

(10) Patent No.: US 8,589,833 B2
(45) Date of Patent: Nov. 19, 2013

(54) METHOD FOR THE DEFINITION OF A LIBRARY OF APPLICATION-DOMAIN-SPECIFIC LOGIC CELLS

(75) Inventors: Dipti Motiani, Santa Clara, CA (US); Veerbhan Kheterpal, Sunnyvale, CA (US); Lawrence T. Pileggi, Pittsburgh, PA (US)

(73) Assignee: PDF Acquisition Corp., San Jose, CA (US)

( * ) Notice: Subject to any disclaimer, the term of this patent is extended or adjusted under 35 U.S.C. 154(b) by 0 days.

(21) Appl. No.: 13/609,789

(22) Filed: Sep. 11, 2012

(65) Prior Publication Data
US 2013/0007676 A1 Jan. 3, 2013

Related U.S. Application Data

(60) Continuation of application No. 12/862,439, filed on Aug. 24, 2010, now Pat. No. 8,271,916, which is a division of application No. 11/619,587, filed on Jan. 3, 2007, now Pat. No. 7,784,013.

(51) Int. Cl.
*G06F 17/50* (2006.01)
*G06F 9/455* (2006.01)

(52) U.S. Cl.
USPC ............................. 716/100; 716/104; 716/132

(58) Field of Classification Search
USPC ........................................ 716/100, 104, 132
See application file for complete search history.

(56) References Cited

U.S. PATENT DOCUMENTS

| 5,682,323 | A | 10/1997 | Pasch et al. |
| 6,505,332 | B1 | 1/2003 | Oda |
| 6,594,808 | B1 | 7/2003 | Kale et al. |
| 6,594,816 | B1 * | 7/2003 | Hauck ........................... 716/104 |
| 6,892,373 | B2 | 5/2005 | Whitaker et al. |
| 7,003,738 | B2 | 2/2006 | Bhattacharya et al. |
| 7,340,473 | B2 * | 3/2008 | Paruthi et al. ................. 707/803 |
| 8,015,517 | B1 | 9/2011 | Reis et al. |
| 2002/0053063 | A1 | 5/2002 | Bhattacharya et al. |
| 2003/0149953 | A1 | 8/2003 | Whitaker et al. |
| 2004/0143797 | A1 | 7/2004 | Nguyen et al. |
| 2005/0028128 | A1 | 2/2005 | Sachs |
| 2006/0112361 | A1 * | 5/2006 | Lyalin et al. ....................... 716/9 |
| 2006/0190893 | A1 * | 8/2006 | Morton ........................... 716/10 |
| 2007/0011643 | A1 | 1/2007 | Wang et al. |
| 2007/0050744 | A1 * | 3/2007 | Lyalin et al. .................... 716/10 |
| 2007/0083831 | A1 * | 4/2007 | Hamilton et al. ................. 716/1 |

(Continued)

OTHER PUBLICATIONS

Arikati, S., et al., "A Signature Based Approach to Regularity Extraction", IEEE, 1997, pp. 542-545. cited by other.

(Continued)

*Primary Examiner* — Vuthe Siek
*Assistant Examiner* — Magid Dimyan
(74) *Attorney, Agent, or Firm* — Pillsbury Winthrop Shaw Pittman LLP

(57) ABSTRACT

The present invention provides in one aspect a method of defining a logic cell library composed of complex functions and simple functions, with some of the complex functions obtained from identifying logic function patterns. In another aspect the present invention provides a method of designing a representation of an integrated circuit that uses complex functions and simple functions, with the complex functions including a plurality of non-standard complex Boolean logic functions that are determined to collectively provide for logic pattern minimization.

12 Claims, 4 Drawing Sheets

(56) References Cited

U.S. PATENT DOCUMENTS

| | | | |
|---|---|---|---|
| 2007/0094621 A1* | 4/2007 | Panteleev et al. | 716/3 |
| 2007/0124717 A1* | 5/2007 | Deur et al. | 716/18 |
| 2008/0028347 A1* | 1/2008 | Hiraoglu et al. | 716/5 |
| 2008/0120588 A1 | 5/2008 | Becker | |
| 2008/0127000 A1 | 5/2008 | Majumder et al. | |
| 2008/0163151 A1 | 7/2008 | Motiani et al. | |
| 2010/0231263 A1* | 9/2010 | Fish et al. | 326/121 |

OTHER PUBLICATIONS

Brayton, R.K., et al., "Multilevel Logic Synthesis", Proc. Of the IEEE, vol. 78, No. 2, Feb. 1990, pp. 264-300.

Chowdhary, A., et al., "Extraction of Functional Regularity in Datapath Circuits", IEEE Trans. On CAD of IC and Sys., vol. 18, No. 9, pp. 1279-1296, 1999.

De Micheli, G., "Technology Mapping of Digital Circuits", IEEE, 1991, pp. 580-586.

Keutzer, K., "DAGON: Technology Binding and Local Optimization", 24.sup.th ACM/IEEE Design Automation Conf., pp. 341-347, 1987.

Koorapaty, A., et al., "Exploring Logic Block Granularity for Regular Fabrics", Proc. Of the Design, Automation and Test in EP Conf., 2004, pp. 1-6.

Kheterpal, V., et al., "Design Methodology for IC Manufacturability Based on regular Logic Bricks", DAC 2005, Jun. 13-17, 2005, Anaheim CA, pp. 353-358.

Kukimoto, Y., et al., "Delay-Optimal Technology Mapping by DAG Covering", Whitepaper, pp. 348-351, 1997.

Kutzschebauch, T., "Efficient Logic Optimization Using Regularity Extraction", IEEE, pp. 487-493, 2000.

Motiani, D., "Implementation Flow for Design Using Regular Fabric Logic Bricks", Carnegie Mellon University whitepaper, Aug. 2005, pp. 1-31.

Pileggi, Larry, "AffordableFabrics and Flows Overview: 2004 Annual Review", Center for Circuit and System Solutions presentation, Mar. 29, 2004, p. 1-18.

Rao, D., et al., "On Clustering for Maximal Regularity Extraction", IEEE Trans. On CAD of IC and Sys., vol. 12, No. 8, Aug. 1993, pp. 1198-1208.

\* cited by examiner

METHOD FOR THE DEFINITION OF A LIBRARY OF APPLICATION-DOMAIN-SPECIFIC LOGIC CELLS

This application is a continuation of U.S. patent application Ser. No. 12/862,439 filed Aug. 24, 2010 which is a divisional of U.S. patent application Ser. No. 11/619,587 filed Jan. 3, 2007, now U.S. Pat. No. 8,271,916 Issued Aug. 24, 2010, and is hereby incorporated by reference.

FIELD OF THE INVENTION

The present invention relates to a method for the definition of a library of application-domain-specific logic cells.

BACKGROUND

Typical integrated circuit design environments make use of libraries of pre-designed standard cells (a cell library) which usually consist of from 500 cells to more than 1,000 cells. These libraries are composed of a number of simple, generic and standard logic functions that have been implemented in a form suitable for manufacturing. Each standard cell is a representation, typically the mask level representation, of the circuit that performs the logic function for that cell.

The logic functions performed by the cells in a typical cell library are intentionally general purpose and basic and represent common, low-level logic functions such as AND, OR, XOR, AND-OR-INVERT (AOI), Multiplexer, Adder, etc. These are functions are representative of patterns that are recognized by logic designers, and those that are used as the building blocks for manual logic design. Full custom logic design at the transistor level can sometimes include complex AOI functions that are identifiable from their logic description, such as:

$(\overline{a+b})(c+d)$

But such functions are typically not included in standard cell libraries, and not representative of specific basic building blocks that are known to logic designers. Instead, they are more likely to be custom designed at the transistor level as an AOI gate.

A portion of a typical integrated circuit (IC) design flow 100 is shown in FIG. 1. In the figure, an IC design is first shown as being present in step 110, which is then translated to logic gates in step 120. In most cases this translation is performed by an automatic logic synthesis tool to derive a netlist based on a set of the aforementioned generic logic functions. This translation is often necessary as there are many different methods in common use for design specification. Those methods may include specification using a high-level programming language such as Verilog, VHDL or C or by manually entering schematics using a computer-aided design system.

As a high level language cannot be directly implemented into the physical layout of an integrated circuit, it is first converted to a gate level implementation. The result of a conversion step 130 is a representation of the design called a gate level netlist. This representation is usually in the form of simple logic functions such as NAND, NOR, etc. along with a representation of the connections between functions (the netlist).

Automatic logic synthesis tools are then generally used, as shown at library binding step 140, to bind a design to an implementation, based on a set of manufacturing technology specific logic cells from a cell library 150. The synthesis tool selects cells from the library 150 based on a set of implementation goals that may include any combination of metrics related to area, performance or power and possibly manufacturing yield, to obtain a cell-based netlist 160.

Within the context of the conventional design flow as described above, techniques for optimization using regularity extraction have been proposed for designs dominated by datapaths, which are formed by a small number of repeating logic elements (or bit slices) that are interconnected in a very organized pattern, and other regular circuit structures including RAMs, PLAs, array multipliers etc. For such designs, identifying repeating regularity in circuits simplifies the effort required via synthesis, optimization and layout. However, such regularity extraction techniques rely on the assumption that the designs inherently have within them a high degree of regularity. For example, most of these techniques use information such as bus names and datapath features such as high-fanout control nets to identify repeating structures, such as bit slices. These techniques do not apply, therefore, to more general design flows and logic descriptions that are without such organization and repetition. Also, these techniques to identify repeating regularity do not modify the underlying structural or functional topology of the circuit, which further makes them ineffective for generalized logic and random logic applications.

SUMMARY OF THE INVENTION

The present invention relates to a method for the definition of a library of application-domain-specific logic cells.

In one aspect, the present invention provides a method of defining a logic cell library composed of complex functions and simple functions, with some of the complex functions obtained from identifying logic function patterns.

In a particular aspect, the method of defining a logic cell library includes providing a sample of circuit representations of Boolean logic functions from at least one portion of one or more integrated circuit designs, the circuit representations containing at least a plurality of sets of interconnected circuit representations, wherein each of set interconnected circuit representations includes interconnected Boolean logic functions that contain recurring Boolean logic chains therein; identifying logic function patterns within the sample, the logic function patterns including at least some of the recurring Boolean logic chains; determining a set of complex functions that together can substantially specify a significant portion of the sample, wherein the set of complex functions includes a plurality of non-standard complex Boolean logic functions that are each derived from the identified logic function patterns of the recurring Boolean logic chains, wherein substantially all of the plurality of non-standard complex Boolean logic functions each have at least three inputs; and determining a set of simple functions that, together with the set of complex functions, can together completely specify the sample.

Another aspect of the present invention provides method of designing a representation of an integrated circuit that uses complex functions and simple functions.

In one aspect, the complex functions include a plurality of non-standard complex Boolean logic functions that are determined to collectively provide for logic pattern minimization.

In a particular aspect, the method of designing a representation of an integrated circuit for a particular application design space includes providing a cell library that has a set of complex functions and a set of simple functions, the set of complex functions including a plurality of non-standard complex Boolean logic functions that are determined to collectively provide for logic minimization; providing a high-level representation of the integrated circuit, the high-level representation including circuit representations of Boolean logic functions; and translating the high level representation of the integrated circuit into the representation, wherein the representation is completely defined using the set of complex functions and the set of simple functions, and wherein a substantial portion of the integrated circuit is defined using the set of complex functions.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

Figure 1:
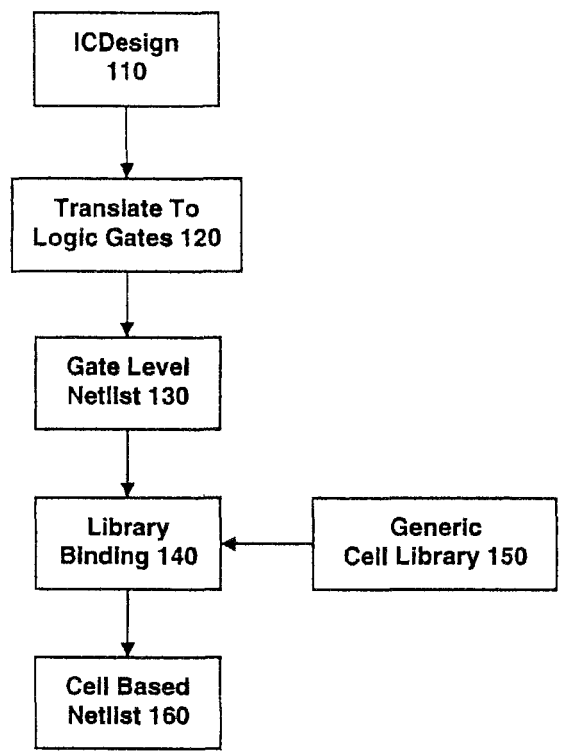
FIG. 1 illustrates a portion of a flow for designing conventional integrated circuit.

The invention provides a method and process for defining complex logic cells used for the design of an integrated circuit. Logic operations are conventionally described using a Boolean equation, which is a formal method for expressing a logic operation. In particular, the present invention provides a method and process for defining complex logic cells that are each made from non-standard complex Boolean logic functions. These non-standard complex Boolean logic functions are each derived from the identified logic function patterns of the recurring Boolean logic chains that are found in an integrated circuit design for the logic of a particular application space, as described further herein. According to the invention, and as described further herein, substantially all of the non-standard complex Boolean logic functions each have at least three inputs and a depth of at least three standard cell functions. Thus, each of the resulting complex logic cells are based on one of a set of complex logic functions that have been automatically derived to match the requirements of a specific design or design space. By design space is meant a set of applications representing a common application domain, such as network processors, or digital signal processing (DSP), as two examples.

By contrast, traditional design techniques utilize cells representing logic functions that are generic and simple in nature, such as NAND and NOR, or even more complex AND-OR-INVERT (AOI). This new approach results in a targeted and efficient collection of complex cells that enables an improved implementation of integrated circuit designs. At the same time, the resulting cell library is relatively small—usually less than 40 cells, with most of these cells, typically over 75%, being the complex logic cells. When compared to traditional approaches which often result in cell libraries containing over 1,000 cells, this much smaller cell library simplifies cell design and analysis for manufacturability, and requires significantly less maintenance as the semiconductor process is changed.

In the approach described herein, a generic cell library is not used. Instead a specific design representation (which can be in the form of an RTL representation, a gate-level netlist, a behavioral description or some other source level or intermediate level description of a design) for an entire integrated circuit, for entire integrated circuits, or for a portion of an integrated circuit or integrated circuits is analyzed to determine a set of non-standard complex Boolean logic functions that are optimal for the implementation of the design.

RTL stands for register transfer logic. This is a commonly used style of design description which specifies the storage elements in a design (the registers) and the logic operations that occur between those storage elements. The logic operations may be described as a netlist of logic functions or may be specified with logic equations.

This analysis can be extended to simultaneously cover any number of designs or portions of designs, thereby determining a set of non-standard complex Boolean logic functions that are optimal for implementation in a design space (set of designs representing an application domain). The precise set of non-standard complex Boolean logic functions determined by this method can vary depending on the target design goals, including relative values and prioritization of area, performance, power, manufacturing yield or any other criteria of interest, uniquely or in combination.

The non-standard complex Boolean logic functions thus determined are then implemented in a style suitable for manufacturing and are collected into a cell library that is specific to a single design or to a class or style of designs as represented in the analysis. Rather than only representing "standard" logic functions, the cells resulting from the analysis will implement the non-standard complex Boolean functions that were found in the analyzed designs, as well as a small number of "standard" or simple logic functions that can be used along with the non-standard complex Boolean functions to fully specify an integrated circuit design. These non-standard complex Boolean functions are represented by complex Boolean equations and can have a large number of inputs as well as multiple outputs, typically at least 3 inputs and having 3 levels of depth (when viewed as a standard cell function). A few examples of such complex functions, for varying number of inputs, are:

$$a(b \oplus c)(de + \overline{f} + \overline{g}) + fgh(\overline{d} + \overline{e})$$

$$a\overline{d}(b \oplus c) + de$$

$$a \oplus \overline{bd}$$

It is noted that although the last function has only 3 inputs, this is a non-traditional logic function that requires at least 14 transistors for its implementation, and is not a function that is typically used as a standard cell.

Table 1 below illustrates a cells that are typical of a conventional cell library. Table 2 below illustrates a set of complex cells according to the present invention, which are usable together to implement a particular integrated circuit:

TABLE 1

Typical Standard Cell Library
Max number of literals (inputs) is 5
Cells with max number of inputs are simple, well known logic functions
All of these functions are considered "standard"

| Cell | Function(Z) |
|---|---|
| 1 | A&B |
| 2 | A&B&C |
| 3 | A&B&C&D |
| 4 | A&B + C |
| 5 | A&B + C&D |

TABLE 1-continued

Typical Standard Cell Library
Max number of literals (inputs) is 5
Cells with max number of inputs are simple, well known logic functions
All of these functions are considered "standard"

| Cell | Function(Z) |
|---|---|
| 6 | A&B&C + D |
| 7 | A&B&C + D&E |
| 8 | A&B&C + D&E&F |
| 9 | A&B + C + D |
| 10 | A&B + C&D + E |
| 11 | A&B + C&D + E&F |
| 12 | A&B&C + D + E |
| 13 | A&B&C + D&E + F |
| 14 | !(A&B + C) |
| 15 | !(A&B&C + D) |
| 16 | !(A&B + C&D) |
| 17 | !(A&B&C + D) |
| 18 | !(A&B&C + D&E) |
| 19 | !(A&B&C + D&E&F) |
| 20 | !(A&B + C + D) |
| 21 | !(A&B + C&D + E) |
| 22 | !(A&B + C&D + E&F) |
| 23 | !(A&B&C + D + E) |
| 24 | !(A&B&C + D&E + F) |
| 25 | (A&B + C)&D |
| 26 | ((A + B)&C) + D |
| 27 | !((A&B + C)&D) |
| 28 | !(((A + B)&C) + D) |
| 29 | A&!B + C&B |
| 30 | !A&!B + C&B |
| 31 | A&!B&!C + D&B&!C + E&!B&C |
| 32 | A&!B&!C + D&B&!C + E&!B&C + F&B&C |
| 33 | !(A&!B + C&B) |
| 34 | !(A&!B&!C + D&B&!C + E&!B&C) |
| 35 | !(A&!B&!C + D&B&!C + E&!B&C + F&B&C) |
| 36 | !(A&B) |
| 37 | !(!A&B) |
| 38 | !(A&B&C) |
| 39 | !(!A&B&C) |
| 40 | !(A&B&C&D) |
| 41 | !(!A&!B&C&D) |
| 42 | !(A + B) |
| 43 | !(!A + B) |
| 44 | !(A + B + C) |
| 45 | !(!A + B + C) |
| 46 | !(A + B + C + D) |
| 47 | !(!A + !B + C + D) |
| 48 | (A + B)&C |
| 49 | (A + B)&(C + D) |
| 50 | (A + B + C)&D |
| 51 | (A + B + C)&(D + E) |
| 52 | (A + B + C)&(D + E + F) |
| 53 | (A + B)&C&D |
| 54 | (A + B)&(C + D)&E |
| 55 | (A + B)&(C + D)&(E + F) |
| 56 | (A + B + C)&D&E |
| 57 | !(A&(B + C)) |
| 58 | !(A&(B + C + D)) |
| 59 | !((A + B)&(C + D)) |
| 60 | !((A + B + C)&D) |
| 61 | !((A + B + C)&(D + E)) |
| 62 | !((A + B + C)&(D + E + F)) |
| 63 | !((C + D)&A&B) |
| 64 | !((A + B)&C&(D + E)) |
| 65 | !((A + B)&(C + D)&(E + F)) |
| 66 | !((A + B + C)&D&E) |
| 67 | A + B |
| 68 | A + B + C |
| 69 | A + B + C + D |
| 69 | A&B + !A&!B |
| 70 | !A&!B&!C + A&B&!C + A&!B&C + !A&B&C |
| 71 | A&!B + !A&B |
| 72 | A&!B&!C + !A&B&!C + !A&B&C + A&B&C |

TABLE 2

Example of 12 application-specific complex
functions according to the present invention
(Uses terminology of p0, p1, etc., instead of A, B etc.)
Up to 7 inputs in this set of bricks, and none of the functions
are "standard" functions
Each complex function shown here would be implemented
by several standard cell functions in a conventional design 1. ((!p3 & p0 & p1) + (!p3 & p0 & p2) + (!p3 & p1 & p2) + (!p3 & p2) + (p4 & p5));
2. ((!p3 & !p4) + (!p3 & p0 & p1) + (!p3 & p1 & p2));
3. ((!p2 & p0 & p5) + (!p2 & p0 & !p4 & !p1) + (!p2 & p5 & !p4 & !p1) + (!p2 & !p4 & !p1) + (p4 & p3 & p6) + (p1 & p3 & p6));
4. ((!p3 & p0 & p1) + (!p3 & p0 & p2) + (!p3 & p1 & p2) + (!p3 & p1) + (p3 & !p0 & !p1) + (p3 & !p1 & !p2));
5. ((!p3 & !p0) + (!p3 & p1) + (!p3 & p2) + (!p4 & p0) + (!p4 & p1) + (!p4 & !p2));
6. ((p4 & p3) + (p0 & p2) + (p1 & p2));
7. ((p0 & p3) + (p0 & !p1 & !p2) + (p3 & !p1 & !p2) + (!p1 & !p2) + (p4 & p5) + (p4 & !p6 & !p7) + (p5 & !p6 & !p7) + (!p6 & !p7));
8. ((!p3 & !p4 & p0 & p1) + (!p3 & !p4 & p0 & p2) + (!p3 & !p4 & p1 & p2) + (!p3 & !p4 & p1) + (!p3 & p4 & !p0 & !p1) + (!p3 & p4 & !p1 & !p2) + (p3 & !p4 & !p0 & !p1) + (p3 & !p4 & !p1 & !p2) + (p3 & p4 & p0 & p1) + (p3 & p4 & p0 & p2) + (p3 & p4 & p1 & p2) + (p3 & p4 & p1));
9. ((!p5 & p2) + (!p5 & !p4 & !p3 & p0) + (!p5 & !p4 & !p3 & p1) + (!p5 & !p4 & p0) + (!p5 & !p4 & p1) + (!p5 & !p3 & p0) + (!p5 & !p3 & p1) + (p2 & p4 & p3) + (p2 & p4 & !p0 & !p1) + (p2 & p3 & !p0 & !p1) + (p2 & !p0 & !p1));
10. ((!p3 & !p0 & p1) + (!p3 & p0 & !p1) + (p2 & !p0 & !p1) + (p2 & p0 & p1));
11. ((!p3 & p0 & !p1) + (!p3 & p0 & !p2) + (!p3 & p0) + (!p3 & !p1 & !p2) + (!p4 & p0 & !p1) + (!p4 & p0 & !p2) + (!p4 & p0) + (!p4 & !p1 & !p2));
12. ((p4 & !p0 & !p1) + (p4 & !p0 & !p2) + (p4 & !p1 & !p2) + (p4 & !p2) + (p4 & !p3) + (p0 & p2 & !p3) + (p1 & p2 & !p3));

In practice, these complex cells can be implemented with a small number of output drive strength options (options to drive different loads placed on its output), including an option for these complex cells to have only one output drive strength. This keeps the count of unique cells in the cell library small, simplifying library development, including analysis and maintenance of the manufacturability when implemented in a design with other cells and memories. In order to have the capability to match a cell's output drive capability with loads of varying magnitudes, the complex cells can then be used in combination with a set of inverting and non-inverting buffers of varying sizes as well as in possible combination with a set of simple logic gates of fixed or varying drive strengths.

Figure 2:
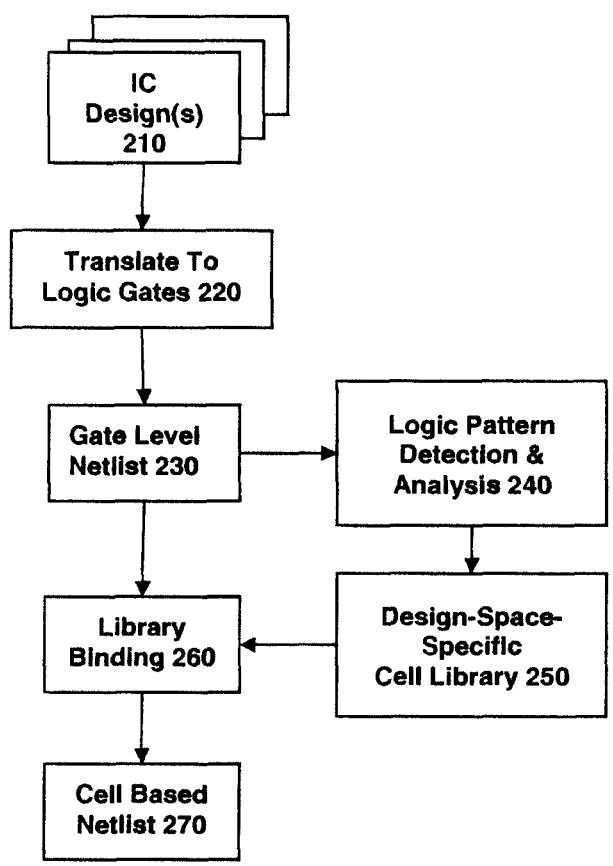
FIG. 2 illustrates a portion of a flow for designing an integrated circuit according to the present invention.

This new approach 200 is shown in FIG. 2. Multiple IC designs are illustrated in step 210 entering the top of the flow. The goal of IC design selection step 210 is to analyze one or more designs or portions of designs that represent a "design space" which is a unique combination of design, design tools, design methodology and design style that are shared by multiple applications, but of the same or similar application domain. Those designs (or portions of designs) are then translated in step 220 to logic gates. Step 230 follows and the logic gates are then converted to a gate level implementation as shown in gate level netlist step 230. The gate level netlist is then analyzed in step 240 for recurring logic patterns, which would be viewed as random in a conventional design, suitable for addition to the logic cell library according to the present invention. It is noted that the step 240 logic pattern analysis can be performed at any stage of the design flow including technology independent optimization stage, technology binding stage or the place and route stage, though for purposes of this description is shown following the conversion to the gate level netlist. However, the analysis 240 gets progressively more efficient when it is performed higher up in the design flow (such as prior to the gate level netlist conversion or prior to the translation to logic gates) due to increased flexibility of implementation of logic. Once the cell library is created, as shown at step 250, and resulting from the collection of non-standard complex Boolean functions that are used in a design space, a mapping or synthesis tool can be used in the library binding step 260 to bind the analyzed designs (in the form of the gate level netlist as shown) or other similar designs to the cells in the cell library, to thereby create the cell based netlist shown at 270.

Logic Pattern Bias

Bias, also referred to as logic pattern bias, is the tendency of a design or design tool to exhibit or create recurring patterns of identical or functionally equivalent logic structures. The approach described here is effective because most styles of design specification, synthesis or mapping have a bias towards creating certain recurring non-standard complex logic patterns resulting from recurring non-standard complex Boolean functions. In addition, certain types of designs exhibit inherent logic pattern regularity. Further, with sufficiently advanced techniques, logic pattern bias can be detected in many styles of design representation. Once detected, this bias may be exploited by creating complex logic cells that directly and efficiently implement the recurring patterns that result from this logic pattern bias.

In most cases, the logic patterns that are identified are the result of a number of different bias contributors. For example, a typical integrated circuit design is often specified by using a high-level language such as Verilog or VHDL. A design may include previously developed logic components either from previous designs or from collections of complex IP (whether static or dynamically generated), which complex IP can include a the intellectual property from a collection of previously designed and verified functional building blocks or components. These components may be created in-house or licensed from commercial vendors, for example. A design can also incorporate components implemented using different methods of specification, including schematic capture or direct netlist implementation or netlist generation by software. All of these contributors are used during the specification of a design and all have the potential to introduce significant logic pattern bias.

Designs typically include some level of hierarchy which may also lead to logic pattern bias. In addition, certain design tools, such as logic synthesis tools, can exhibit a tendency towards generating logic pattern bias. In some cases, the patterns generated by designs tools are incidental to the algorithms used within the tool, and in other cases a design tool might have been designed to intentionally and deterministically generate certain logic patterns.

Each of the bias contributors described in the above paragraphs can be thought of as cumulative, resulting in a compound bias, which is the overall logic pattern bias resulting from a design passing through several stages of a design flow, each of which may introduce logic pattern bias or modify the logic pattern bias introduced by previous stages. A modern design flow consists of many design tools that operate on a design in stages. Each stage has the potential to contribute logic pattern bias, or to modify the bias introduced by prior stages. In some cases, the logic patterns can be the direct result of the interaction between stages; for example, the specific interaction between a hierarchical IP library and a certain synthesis algorithm can lead to a unique logic pattern set that may not be apparent in the IP library before processing by the synthesis tool.

Because of this bias compounding, it can be useful to analyze the design for logic pattern bias at different points in the design flow.

Logic pattern bias can also be introduced by adding an optimization dimension (other than area, performance, power etc.) of regularity to logic synthesis and optimization techniques such as factoring, decomposition, gate duplication etc. This dimension can be added to optimizations at one or more stages of the design flow such as at the technology independent optimization stage, the technology binding stage or the place and route stage. Often, this dimension can be added without any penalty to area, performance and other constraints.

Implementation

The set of specific non-standard complex Boolean logic functions that is derived for a given design space is usable to define a cell library that has far fewer cells than a standard cell library.

By contrast, traditional design techniques map designs to a set of logic functions that are generic and simple in nature. This new approach results in a targeted and efficient collection of complex cells that allows for an improved implementation of integrated circuit designs. At the same time, the resulting cell library is relatively small—usually less than 40 cells, with most of them, typically 75%, being complex cells that together allow for representation of substantially all of a design for that design space. When compared to traditional approaches which often result in cell libraries containing over 1,000 cells, this much smaller cell library simplifies cell layout, analysis and maintenance.

The cell library resulting from this new approach can be a combination of some number of complex cells implementing complex functions, along with a number of simple cells. The complex cells directly and efficiently implement the non-standard complex Boolean equations that in a traditional design environment may never have been identified or more likely would have been decomposed to (a potentially large number of) simple and less efficient cells. The few simple cells used in the cell library according to the present invention can be used to implement the remaining parts of the design that don't fit well into the complex cells resulting from the logic pattern bias analysis step as described. These simple cells include INVERT, AND, OR, and NOR logic functions, for example.

For the simple and complex logic functions described herein, for each logic function, it is understood that different parameters can be included, such as drive strength, which will allow for that same function to exist with different parameters. It is, however, still the same logic function, as used herein.

By keeping complex logic functions at a high level and not reducing them to basic gates, they can be directly implemented using relatively more efficient transistor-level design techniques. The resulting integrated circuit designs will generally have a beneficial combination of reduced area and power, as well as improved performance and yield characteristics when compared to designs based on traditional standard cell design techniques.

Specifics of Pattern Analysis Implementation

Figure 3:
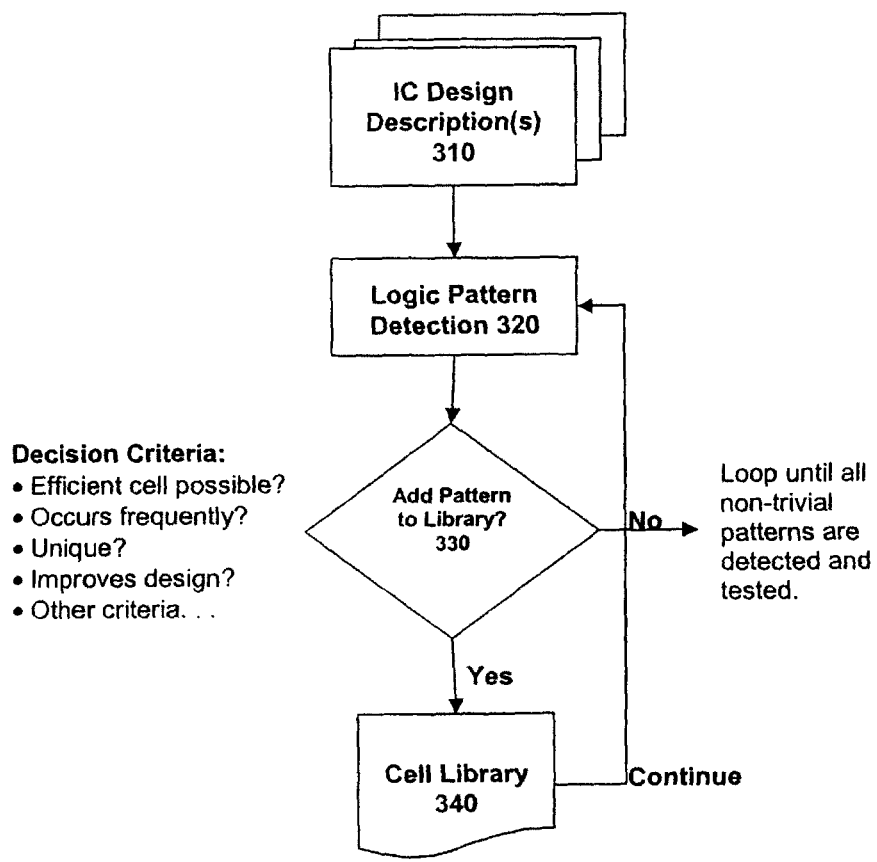
FIG. 3 illustrates a more detailed flow of logic pattern analysis according to the present invention.

Integrated circuit designs or portions of integrated circuit designs are analyzed to identify complex logic functions that are candidates for cell level implementation and inclusion in a cell library, as described previously in step 240 of FIG. 3. This step is illustrated in more detail in FIG. 3, which shows a flow chart of this process. In performing this analysis, patterns of connected logic structures taken from IC design descriptions illustrated at 310 that form complex functions are identified as shown at logic pattern detection step 320 and prioritized, as shown at decision step 330 whether to add a specific non-standard complex Boolean function to the cell library from the corresponding pattern identified, based on software which is written to answer some combination the following questions to implement steps 320 and 330, upon execution of the software and operation of the software on the design in question:

How Efficiently, Actually or Expected, can the Function be Implemented in a Stand-Alone Cell?

It is important to determine if the candidate function can be efficiently implemented as a cell and if the resulting implementation would have an advantage over an implementation of the function based on a composition of simpler cells that are likely to be available in the cell library. To make this determination, comparisons must consider performance, power, area and yield differences in a ranking appropriate to a set of specific design goals.

Cell size and complexity must be carefully analyzed. For example, if the function is too simple, then the benefits of the resulting cell may not be significant, in which case the additional complexity created by adding the function to the cell library might not be justified. And if the function is too complex, then this can be an indication that the resulting cell is too design specific and would not add incremental benefit over the span of the general design space. In addition, overly complex functions can result in cells that are large and can lead to poor place and route results due to blockage and congestion.

How Frequently does the Function Occur, or is Expected to Occur, in the Overall Design Space?

This can be determined by several methods. One method might be the use of direct pattern matching to locate other parts of the design(s) where the identical function occurs. Another method is to determine if there are other logic functions in the design(s) that can be transformed through some set of operations (such as a DeMorgan transform—which is a simple logic transformation by which an AND function followed by an inversion can be converted to an OR function with an inversion at each input) of logical equivalence to match the candidate function. The goal is to only add complex cells to the cell library if they will be frequently used.

After analysis, the logic functions that are candidates for addition to the cell library can be listed in rank order based on expected usage frequency or some other measure. Experiments can further be performed to determine the incremental benefit of adding the next cell in the ordered list to the cell library. If it is determined that adding more functions provides only a marginal benefit, then the conclusion may be reached that the cell library is complete and no more functions should be added.

How Unique is the Function?

If a candidate function differs from a previously selected function by a trivial logic operation, such as inversion, then the cell may not be a good candidate for the cell library and the function may instead be constructed from the similar cell followed by a simple inverter.

Will Adding the Function to the Cell Library Lead to an Improvement in the Resulting Integrated Circuit Design?

It is possible to identify functions that meet all other criteria, but create no additional power, performance, area or yield advantage over the functions that already exist in the cell library. In this case, the new function adds complexity to the creation and development of the cell library with no benefit and should therefore not likely be added.

How Well does the Set of Chosen Functions Globally Cover the Design?

The tradeoff involves choosing functions in such a way as to maximize the logic covered in the design and to minimize the total number of distinct chosen functions. A certain set of functions might result in better coverage of the design compared to another set of functions even though the individual functions in the latter set might have a higher frequency of occurrence than the individual functions in the former set.

Figure 4:
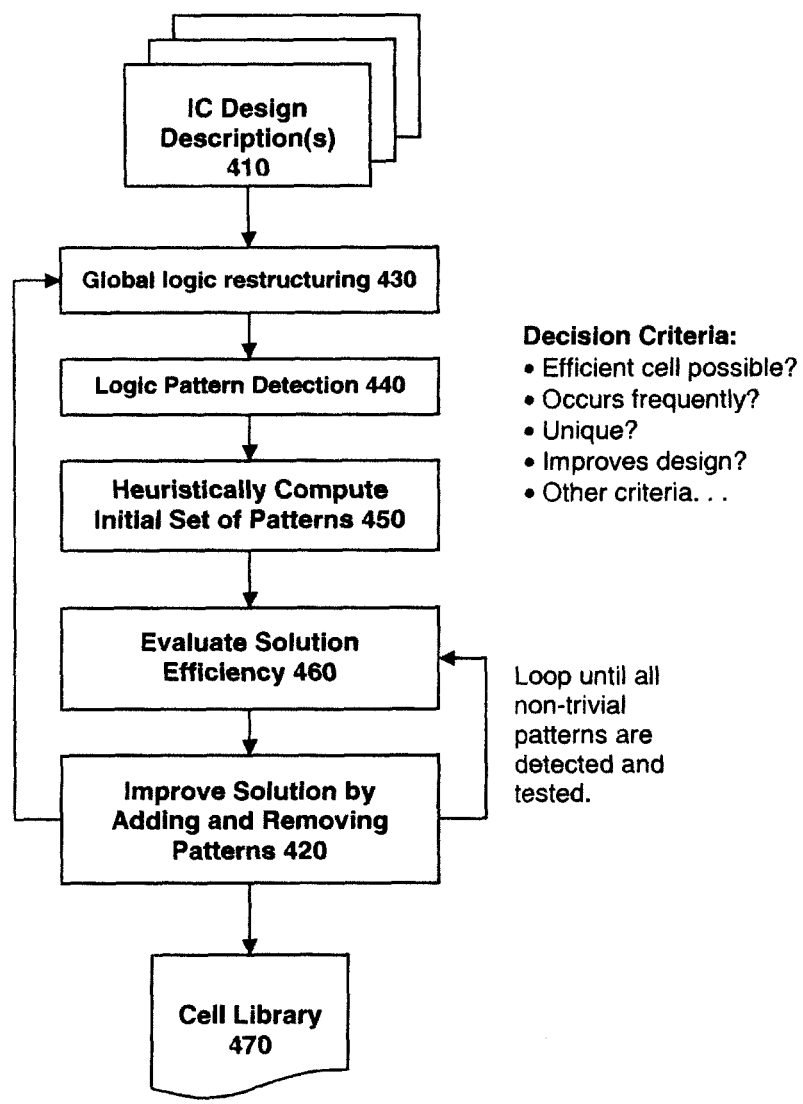
FIG. 4 illustrates another embodiment of logic pattern analysis according to the present invention.

In general, finding an optimal cover is NP-complete. NP-complete problems are the most difficult problems in the class of NP problems (non-deterministic polynomial time) in the sense that they are the smallest subclass of NP that can conceivably remain outside of P, the class of deterministic polynomial-time problems. The reason is that a deterministic, polynomial-time solution to any NP-complete problem would also be a solution to every other problem in NP. Various optimization techniques can be applied to find a good solution. For example, the general solution obtained by the approach shown in FIG. 3 can be iteratively improved. As shown in FIG. 4, for example, it can be improved by taking a cell library that has been decided upon for a particular implementation or design space shown as 410. As shown by step 420, the process will then include removing a complex function from the obtained solution set and adding another promising candidate function at different iterations. Thereafter, the implementation must be restructured based on the remaining simple and complex functions (shown at step 430), and then logic pattern detection is again initiated (step 440), another initial set of patterns generated (step 450), and efficacy of this solution analyzed (step 460). As the iterations progress, the quality of the solution might also worsen (if an essential function is dropped). Finally, the solution with the best cost over all the iterations is chosen, as shown by cell library 470.

The problem of finding an efficient cover can also be formulated as a set-covering problem in which the information is represented in a matrix where the columns are nodes in the graph and rows are candidate functions covering each node. The values in the matrix are the cost with which a row (function) covers the column (node). These costs could be based on various design goals such as the area efficiency, performance efficiency etc. with which the function covers the node. The goal is to find the minimal set of rows that maximizes the total cost of the nodes covered.

In another aspect of the invention, complex functions are implemented in a manner that selects logic chains will translate into a best implementations in terms of area, power and/or performance. Thus, depending on trade-offs of minimizing area, minimizing power, and increasing performance, different sets of complex functions may be implemented. By minimizing logic that is used, that allows for minimization of combination of area, timing (delay) and/or power.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed is:

1. A method of selecting a collection of logic cells that each implement a Boolean Logic Function using a computer, said method including:

selecting, using said computer, at least four simple cells from the group that consists of logic cells (1)-(72) below:
(1) A&B;
(2) A&B&C;
(3) A&B&C&D;
(4) A&B+C;
(5) A&B+C&D;
(6) A&B&C+D;
(7) A&B&C+D&E;
(8) A&B&C+D&E&F
(9) A&B+C+D;
(10) A&B+C&D+E;
(11) A&B+C&D+E&F;
(12) A&B&C+D+E
(13) A&B&C+D&E+F;
(14) !(A&B+C);
(15) !(A&B&C+D);
(16) !(A&B+C&D);
(17) !(A&B&C+D);
(18) !(A&B&C+D&E);
(19) !(A&B&C+D&E&F);
(20) !(A&B+C+D);
(21) !(A&B+C&D+E);
(22) !(A&B+C&D+E&F);
(23) !(A&B&C+D+E);
(24) !(A&B&C+D&E+F);
(25) (A&B+C)&D;
(26) ((A+B)&C)+D;
(27) !((A&B+C)&D);
(28) !(((A+B)&C)+D);
(29) A&!B+C&B;
(30) !A&!B+C&B;
(31) A&!B&!C+D&B&!C+E&!B&C;
(32) A&!B&!C+D&B&!C+E&!B&C+F&B&C;
(33) !(A&!B+C&B).
(34) !(A&!B&!C+D&B&!C+E&!B&C);
(35) !(A&!B&!C+D&B&!C+E&!B&C+F&B&C);
(36) !(A&B);
(37) !(!A&B);
(38) !(A&B&C);
(39) !(!A&B&C);
(40) !(A&B&C&D);
(41) !(!A&!B&C&D);
(42) !(A+B);
(43) !(!A+B);
(44) !(A+B+C);
(45) !(!A+B+C);
(46) !(A+B+C+D);
(47) !(!A+!B+C+D);
(48) (A+B)&C;
(49) (A+B)&(C+D);
(50) (A+B+C)&D;
(51) (A+B+C)&(D+E);
(52) (A+B+C)&(D+E+F);
(53) (A+B)&C&D;
(54) (A+B)&(C+D)&E;
(55) (A+B)&(C+D)&(E+F);
(56) (A+B+C)&D&E;
(57) !(A&(B+C));
(58) !(A&(B+C+D));
(59) !((A+B)&(C+D));
(60) !((A+B+C)&D);
(61) !((A+B+C)&(D+E));
(62) !((A+B+C)&(D+E+F));
(63) !((C+D)&A&B);
(64) !((A+B)&C&(D+E));
(65) !((A+B)&(C+D)&(E+F));
(66) !((A+B+C)&D&E);
(67) A+B 68 A+B +C 69 A+B+C+D;
(69) A&B+!A&!B;
(70) !A&!B&!C+A&B&!C+A&!B&C+!A&B&C;
(71) A&!B+!A&B; and,
(72) A&!B&!C+!A&B&!C+!A&!B&C+A&B&C;
and;

selecting, using said computer, a plurality of complex cells the group that consists of logic cells (i)-(xii) below:
(i)((!D & A & B)+(!D & A & C)+(!D & B & C)+(!D & C) +(E & F));
(ii) ((!D & !E)+(!D & A & B)+(!D & B & C));
(iii) ((!C & A & F)+(!C & A & !E & !B)+(!C & F & !E & !B)+(!C & !E & !B) +(E & D & G)+(B & D & G));
(iv)((!D & A & B)+(!D & A & C)+(!D & B & C)+(!D & B)+(D & !A & !B)+(D & !B & !C));
(v) ((!D & !A)+(!D & B)+(!D & !C)+(!E & !A)+(!E & B)+(!E & !C));
(vi) ((E & D)+(A & C)+(B & C));
(vii) ((A & D)+(A & !B & !C)+(D & !B & !C)+(!B & !C)+(E & F)+(E & !G & !H)+(F & !G & !H)+(!G & !H));
(viii)((!D & !E & A & B)+(!D & !E & A & C)+(!D & !E & B & C)+(!D & !E & B)+(!D & E & !A & !B)+ (!D & E & !B & !C)+(D & !E & !A & !B)+(D & !E & !B & !C) +(D & E & A & B)+(D & E & A & C)+(D & E & B & C)+(D & E & B));
(ix)((!F & C)+(!F & !E & !D & A)+(!F & !E & !D & B)+(!F & !E & A)+(!F & !E & B)+(!F & !D & A)+ (!F & !D & B)+(C & E & D)+( C & E & !A & !B)+ (C & D & !A & !B)+(C & !A & !B));
(x)((!D & !A & B)+(!D & A & !B)+(C & !A & !B)+ ( C & A & B));
(xi) ((!D & A & !B)+(!D & A & !C)+(!D & A)+(!D & !B & !C)+(!E & A & !B) +(!E & A & !C)+(!E & A)+(!E & !B & !C));
(xii) ((E & !A & !B)+(E & !A & !C)+(E & !B & !C)+ (E & !C)+(E & !D)+(A & C & !D)+(B & C & !D));
wherein said complex cells are not formed from combination(s) of simple cells in said collection.

2. The method of selecting the collection of logic cells, as defined in claim 1, wherein said collection includes at least some of said complex cells in multiple drive strengths.

3. The method of selecting the collection of logic cells, as defined in claim 1, wherein over 75% of the cells in said collection are complex cells.

4. The method of selecting the collection of logic cells, as defined in claim 1, wherein said collection includes fewer than forty distinct logic cells.

5. A method of forming a portion of an integrated circuit from collection of logic cells that each implement a Boolean Logic Function and are stored on a computer, the method comprising:

instantiating into the portion of the integrated circuit at least four simple cells that are stored on the computer and selected from the group that consists of logic cells (1)-(72) below:
(1) A&B;
(2) A&B&C;
(3) A&B&C&D;
(4) A&B+C;
(5) A&B+C&D;

(6) A&B&C+D;
(7) A&B&C+D&E;
(8) A&B&C+D&E&F
(9) A&B+C+D;
(10) A&B+C&D+E;
(11) A&B+C&D+E&F;
(12) A&B&C+D+E
(13) A&B&C+D&E+F;
(14) !(A&B+C);
(15) !(A&B&C+D);
(16) !(A&B+C&D);
(17) !(A&B&C+D);
(18) !(A&B&C+D&E);
(19) !(A&B&C+D&E&F);
(20) !(A&B+C+D);
(21) !(A&B+C&D+E);
(22) !(A&B+C&D+E&F);
(23) !(A&B&C+D+E);
(24) !(A&B&C+D&E+F);
(25) (A&B+C)&D;
(26) ((A+B)&C)+D;
(27) !((A&B+C)&D);
(28) !(((A+B)&C)+D);
(29) A&!B+C&B;
(30) !A&!B+C&B;
(31) A&!B&!C+D&B&!C+E&!B&C;
(32) A&!B&!C +D&B&!C+E&!B&C+F&B&C;
(33) !(A&!B+C&B).
(34) !(A&!B&!C+D&B&!C+E&!B&C);
(35) !(A&!B&!C+D&B&!C+E&!B&C+F&B&C);
(36) !(A&B);
(37) !(!A&B);
(38) !(A&B&C);
(39) !(!A&B&C);
(40) !(A&B&C&D);
(41) !(!A&!B&C&D);
(42) !(A+B);
(43) !(!A+B);
(44) !(A+B+C);
(45) !(!A+B+C);
(46) !(A+B+C+D);
(47) !(!A+!B+C+D);
(48) (A+B)&C;
(49) (A+B)&(C+D);
(50) (A+B+C)&D;
(51) (A+B+C)&(D+E);
(52) (A+B+C)&(D+E+F);
(53) (A+B)&C&D;
(54) (A+B)&(C+D)&E;
(55) (A+B)&(C+D)&(E+F);
(56) (A+B+C)&D&E;
(57) !(A&(B+C));
(58) !(A&(B+C+D));
(59) !((A+B)&(C+D));
(60) !((A+B +C)&D);
(61) !((A+B+C)&(D+E));
(62) !((A+B+C)&(D+E+F));
(63) !((C+D)&A&B);
(64) !((A+B)&C&(D+E));
(65) !((A+B)&(C+D)&(E+F));
(66) !((A+B+C)&D&E);
(67) A+B 68 A+B+C 69 A+B+C+D;
(69) A&B+!A&!B;
(70) !A&!B&!C+A&B&!C+A&!B+C+!A&B&C;
(71) A&!B+!A&B; and,
(72) A&!B&!C+!A&B&!C+!A&!B&C+A&B&C;
and;
instantiating into the portion of the integrated circuit a plurality of complex cells that are stored on the computer and selected from the group that consists of logic cells (i)-(xii) below:
(i)((!D & A & B)+(!D & A & C)+(!D & B & C) +(!D & C)+(E & F));
(ii) ((!D & !E)+(!D & A & B)+(!D & B & C));
(iii) ((!C & A & F)+(!C & A & !E & !B)+(!C & F & !E & !B)+(!C & !E & !B) +(E & D & G)+(B & D & G));
(iv)((!D & A & B)+(!D & A & C)+(!D &B & C)+(!D & B)+( D & !A &!B) +(D & !B & !C));
(v) ((!D & !A)+(!D & B)+(!D & !C)+(!E & !A)+(!E & B)+(!E & !C));
(vi) ((E & D)+(A & C)+(B & C));
(vii) ((A & D)+(A & !B & !C)+(D & !B & !C)+ (!B & !C)+(E & F)+(E & !G & !H)+(F & !G & !H)+(!G & !H));
(viii)((!D & !E & A & B)+(!D & !E & A & C)+ (!D & !E & B & C)+(!D & !E & B)+(!D & E & !A & !B)+(!D & E & !B & !C)+(D & !E & !A & !B)+(D & !E & !B & !C)+(D & E & A & B)+(D & E & A & C)+(D & E & B & C)+(D & E & B));
(ix)((!F & C)+(!F & !E & !D & A)+(!F & !E & !D & B)+(!F & !E & A)+(!F & !E & B)+(!F & !D & A)+ (!F & !D & B)+(C & E & D)+(C & E & !A & !B)+ (C & D & !A & !B)+(C & !A & !B));
(x) ((!D & !A & B)+(!D & A & !B) +(C & !A & !B) + (C & A & B));
(xi) ((!D & A & !B)+(!D & A & !C)+(!D & A)+(!D & !B & !C)+(!E & A & !B) +(!E & A & !C) +(!E & A)+(!E & !B & !C));
(xii) ((E & !A & !B)+(E & !A & !C)+(E & !B & !C)+ (E & !C)+(E & !D)+(A & C& !D)+(B & C & !D));
wherein the instantiated complex cells are not formed from combination(s) of simple cells.

6. The method, as defined in claim 5, wherein instantiating a plurality of complex cells includes instantiating at least some of said complex cells in multiple drive strengths.

7. The method, as defined in claim 5, wherein over 75% of the instantiated cells are complex cells.

8. The method, as defined in claim 5, wherein said cells are instantiated from a library that includes fewer than forty distinct logic cells.

9. A method of using a library that includes a collection of logic cells that each implement a Boolean Logic Function by a computer-based synthesis tool, said method comprising:
selecting from the library using the computer-based synthesis tool at least four simple cells selected from the group that consists of logic cells (1)-(72) below:
(1) A&B;
(2) A&B&C;
(3) A&B&C&D;
(4) A&B+C;
(5) A&B+C&D;
(6) A&B&C+D;
(7) A&B&C+D&E;
(8) A&B&C+D&E&F
(9) A&B+C+D;
(10) A&B+C&D+E;
(11) A&B+C&D+E&F;
(12) A&B&C+D+E
(13) A&B&C +D&E +F;
(14) !(A&B+C);

(15) !(A&B&C+D);
(16) !(A&B+C&D);
(17) !(A&B&C+D);
(18) !(A&B&C+D&E);
(19) !(A&B&C+D&E&F);
(20) !(A&B+C+D);
(21) !(A&B+C&D+E);
(22) !(A&B+C&D+E&F);
(23) !(A&B&C+D+E);
(24) !(A&B&C+D&E+F);
(25) (A&B+C)&D;
(26) ((A+B)&C)+D;
(27) !((A&B +C)&D);
(28) !(((A+B)&C)+D);
(29) A&!B+C&B;
(30) !A&!B+C&B;
(31) A&!B&!C+D&B&!C+E&!B&C;
(32) A&!B&!C+D&B&!C+E&!B&C+F&B&C;
(33) !(A&!B+C&B).
(34) !(A&!B&!C+D&B&!C+E&!B&C);
(35) !(A&!B&!C+D&B&!C+E&!B&C+F&B&C);
(36) !(A&B);
(37) !(!A&B);
(38) !(A&B&C);
(39) !(!A&B&C);
(40) !(A&B&C&D);
(41) !(!A&!B&C&D);
(42) !(A+B);
(43) !(!A+B);
(44) !(A+B+C);
(45) !(!A+B+C);
(46) !(A +B +C +D);
(47) !(!A+!B+C+D);
(48) (A+B)&C;
(49) (A+B)&(C+D);
(50) (A+B+C)&D;
(51) (A+B+C)&(D+E);
(52) (A+B+C)&(D+E+F);
(53) (A +B)&C&D;
(54) (A +B)&(C+D)&E;
(55) (A+B)&(C+D)&(E+F);
(56) (A+B+C)&D&E;
(57) !(A&(B+C));
(58) !(A&(B+C+D));
(59) !((A+B)&(C+D));
(60) !((A+B+C)&D);
(61) !((A+B+C)&(D+E));
(62) !((A+B+C)&(D+E+F));
(63) !((C+D)&A&B);
(64) !((A+B)&C&(D+E));
(65) !((A+B)&(C+D)&(E+F));
(66) !((A+B+C)&D&E);
(67) A+B 68 A+B+C 69 A+B+C+D;
(69) A&B +!A&!B;
(70) !A&!B&!C +A&B&!C +A&!B&C +!A&B&C;
(71) A&!B +!A&B; and,
(72) A&!B&!C +!A&B&!C +!A&!B&C +A&B&C;
and;

selecting from the library using the computer-based synthesis tool a plurality of complex cells selected from the group that consists of logic cells (i)-(xii) below:
(i)((!D & A & B)+(!D & A & C)+(!D & B & C)+(!D & C)+(E & F));
(ii) ((!D & !E) +(!D & A & B) +(!D & B & C));
(iii) ((!C & A & F) +(!C & A & !E & !B) +(!C & F & !E & !B) +(!C & !E & !B) +(E & D & G)+(B & D & G));
(iv)((!D & A & B)+(!D & A & C)+.(!D & B & C)+(!D & B)+(D & !A &!B) +(D & !B & !C));
(v) ((!D & !A) +(!D & B) +(!D & !C) +(!E & !A) +(!E & B) +(!E & !C));
(vi) ((E & D) +(A & C) +(B & C));
(vii) ((A & +(A& !B & !C) +(D & !B & !C) +(!B & !C) +(E & +(E& !G & !H) +(F & !G& !H) +(!G & !H));
(viii)((!D & !E & A & B)+(!D & !E & A & C)+(!D & !E & B & C)+(!D & !E & B)+(!D & E & !A & !B)+(!D & E & !B & !C)+(D & !E & !A & !B)+(D & !E & !B & !C)+(D & E & A & B)+(D & E & A & C)+(D & E & B & C)+(D & E & B));
(ix)((!F & C)+(!F & !E & !D & A)+(!F & !E & !D & B)+(!F & !E & A)+(!F& !E & B)+F & !D & A)+(!F & !D & B)+(C & E & D)+(C & E & !A & !B)+(C & D & !A & !B) +(C & !A & !B));
(x)((!D & !A & B)+(!D & A & !B)+(C & !A & !B)+ (C & A & B));
(xi) ((!D & A & !B) +(!D & A & !C) +(!D & A) +(!D & !B & !C) +(!E & A & !B) +(!E & A & !C) +& +(!E & !B & !C));
(xii) ((E & !A & !B) +(E & !A & !C) +(E & !B & !C) + (E & !C) +(E & !D) +(A & C& !D) +(B & C & !D));
wherein said complex cells are not formed from combination(s) of simple cells in said library.

10. The method of using the library, as defined in claim 9, wherein said library includes at least some of said complex cells in multiple drive strengths.

11. The method of using the library, as defined in claim 9, wherein over 75% of the cells in said library are complex cells.

12. The method of using the library, as defined in claim 9, wherein said library includes fewer than forty distinct logic cells.

* * * * *